United States Patent [19]

King et al.

[11] Patent Number: 5,140,405
[45] Date of Patent: Aug. 18, 1992

[54] SEMICONDUCTOR ASSEMBLY UTILIZING ELASTOMERIC SINGLE AXIS CONDUCTIVE INTERCONNECT

[75] Inventors: Jerrold L. King; Jerry M. Brooks, both of Boise; Warren M. Farnworth, Nampa; George P. McGill, Boise, all of Id.

[73] Assignee: Micron Technology, Inc., Boise, Id.

[21] Appl. No.: 677,439

[22] Filed: Mar. 29, 1991

Related U.S. Application Data

[63] Continuation-in-part of Ser. No. 575,179, Aug. 30, 1990.

[51] Int. Cl.$^5$ .................... H01L 23/48; H01L 23/42; H05K 7/02; H01R 4/58
[52] U.S. Cl. ........................ 357/67; 357/72; 357/75; 357/79; 361/400; 439/91
[58] Field of Search .................... 357/72, 74, 79, 75, 357/68, 67; 439/91; 361/400

[56] References Cited

U.S. PATENT DOCUMENTS

| | | | |
|---|---|---|---|
| 4,652,973 | 3/1987 | Baker et al. | 439/91 |
| 4,692,839 | 9/1987 | Lee et al. | 357/81 |
| 4,729,809 | 3/1988 | Dery et al. | 439/91 |
| 4,744,850 | 5/1988 | Imano et al. | |
| 4,902,857 | 2/1990 | Cranston et al. | 439/91 |
| 4,922,376 | 5/1990 | Pommer et al. | 357/79 |
| 4,933,747 | 6/1990 | Schroeder | 357/79 |
| 4,954,873 | 9/1990 | Lee et al. | 357/72 |
| 4,954,875 | 9/1990 | Clements | 357/75 |
| 5,001,542 | 3/1991 | Tsukagoshi et al. | 357/72 |
| 5,006,919 | 4/1991 | Disko | 357/72 |

FOREIGN PATENT DOCUMENTS

| | | | |
|---|---|---|---|
| 2072433 | 9/1981 | United Kingdom | 439/91 |
| 0232127 | 8/1987 | United Kingdom | 439/91 |

*Primary Examiner*—Andrew J. James
*Assistant Examiner*—Cynthia S. Deal
*Attorney, Agent, or Firm*—Wells, St. John & Roberts

[57] ABSTRACT

An semiconductor assembly includes at least one die having substantially planar first and second engagement surfaces and external edges which define a die shape. A base having an opening formed therein receives the die. The base opening has peripheral edges which define an opening shape and size which is complementary to the die external shape. The opening edges engage the die edges to spatially fix the die in a selected orientation in a plane parallel to the die first planar engagement surface. An interconnecting plate has at least one substantially planar engagement surface facing the first planar engagement surface of the die received within the base opening. At least one conductive pad on the plate planar engagement surface is spatially aligned or registered with a corresponding conductive pad on the first engagement surface of the die. A sheet of anisotropically conductive elastomeric material is interposed between the base and interconnecting plate between the first engagement surface of the die and engagement surface of the interconnecting plate. The base and interconnecting plate are clamped relative to one another in selected registration, sandwiching the anisotropically conductive elastomeric material therebetween. This conductively engages the at least one conductive pad of the die with the at least one conductive pad of the interconnecting plate through the sheet of anisotropically conductive elastomeric material.

15 Claims, 7 Drawing Sheets

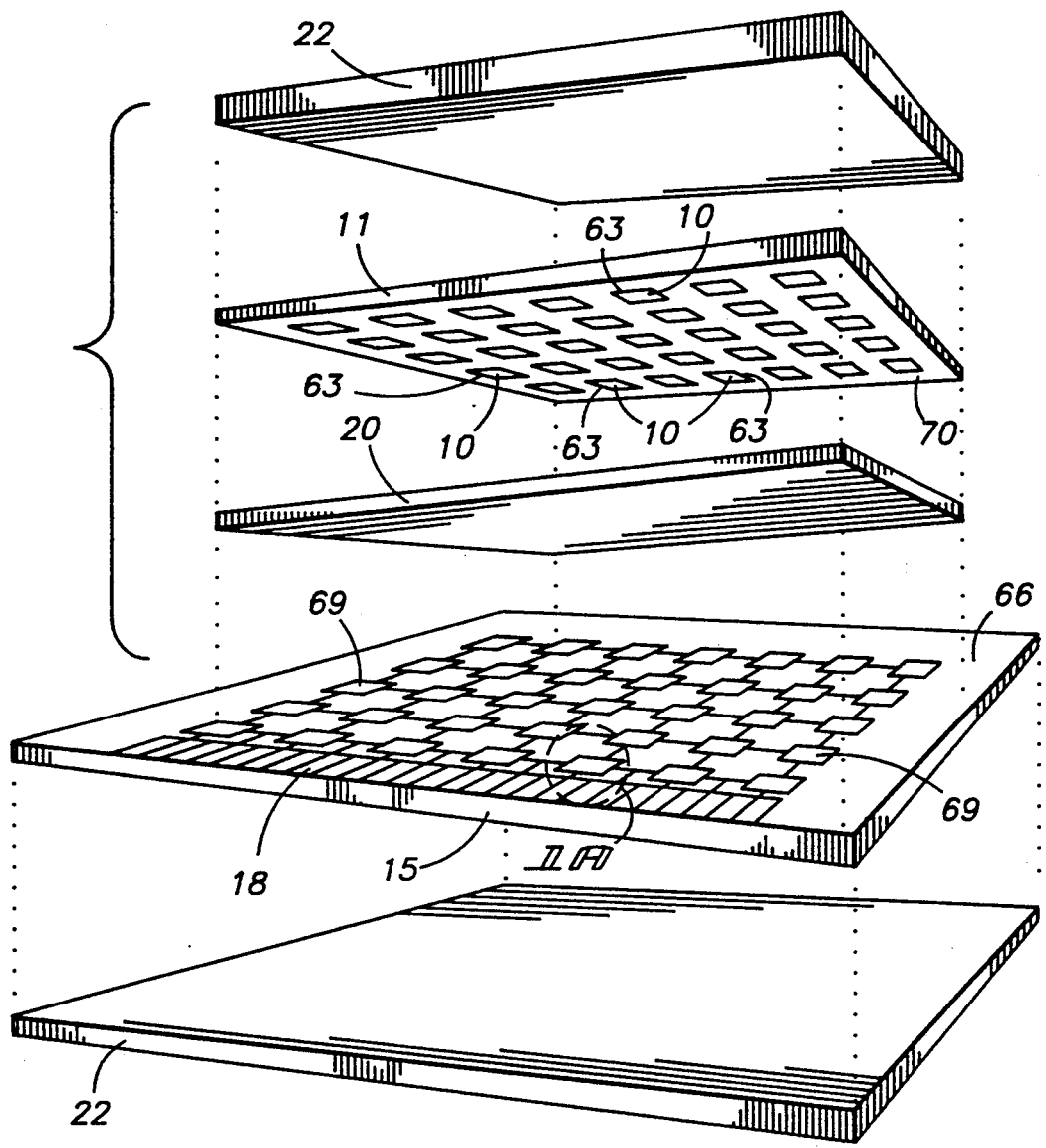
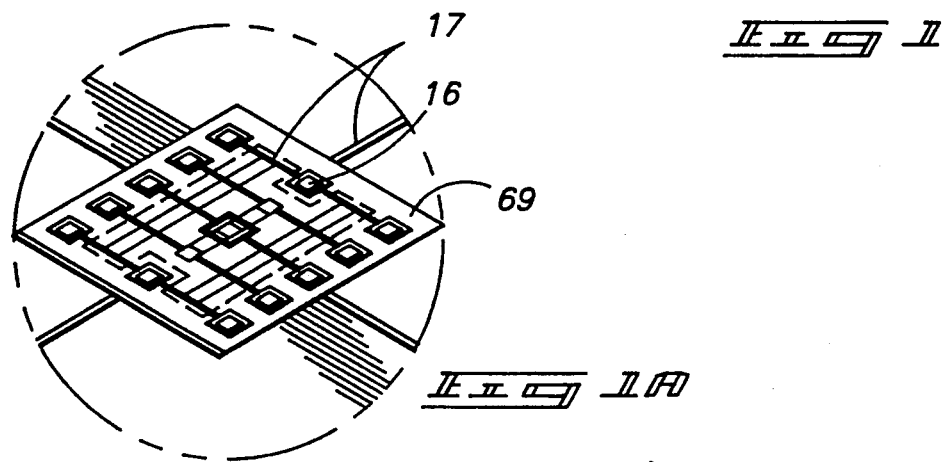
FIG. 1
FIG. 1A

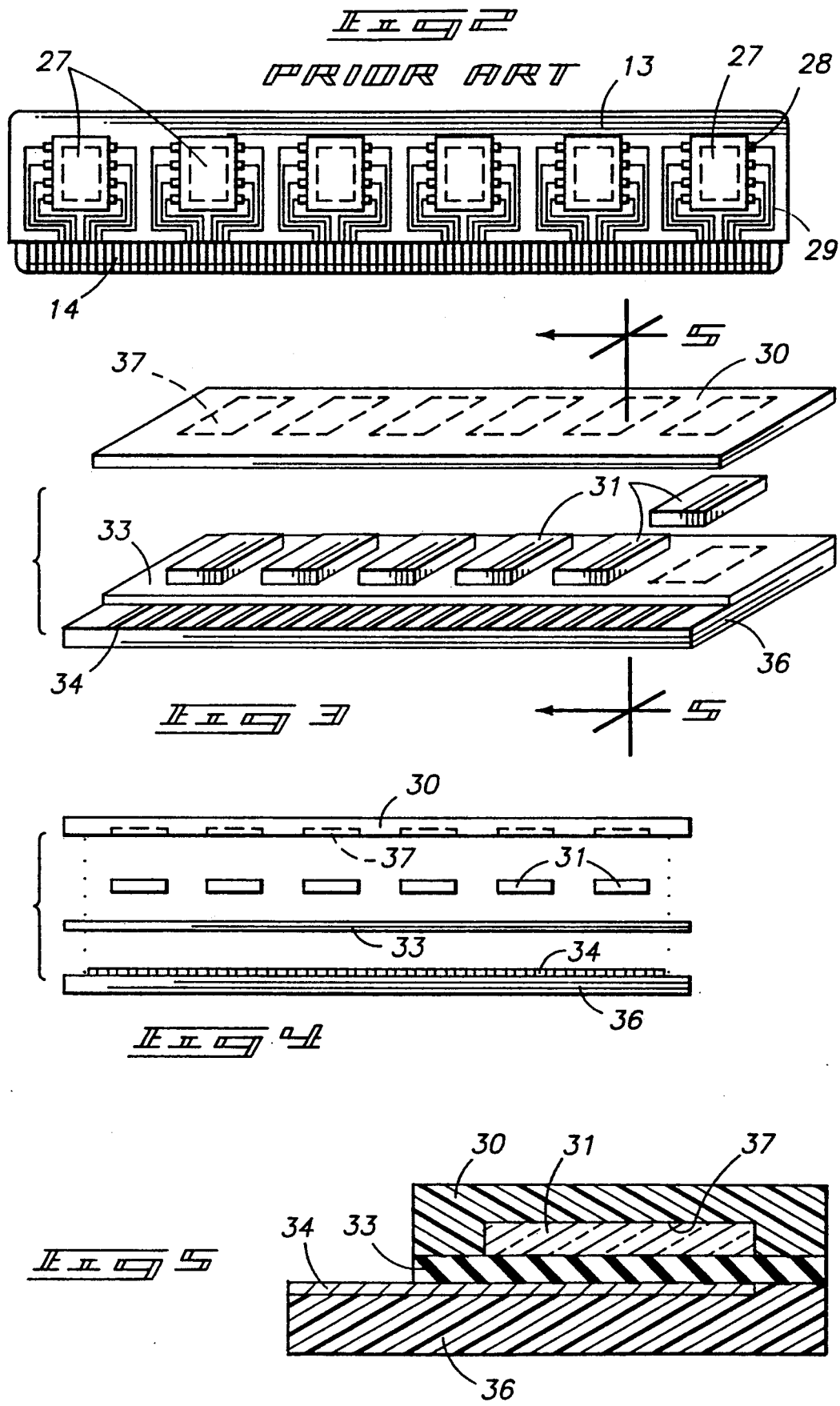

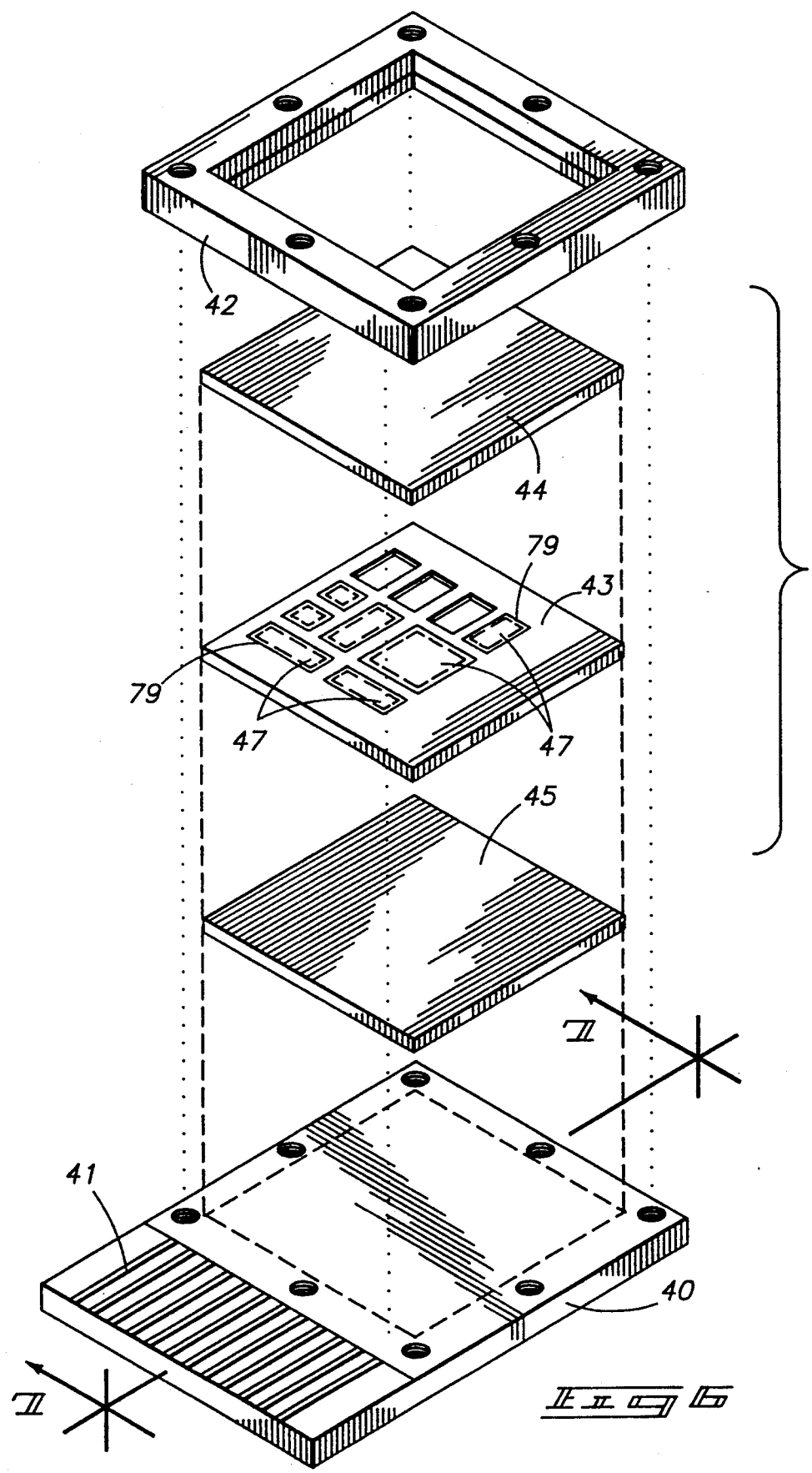

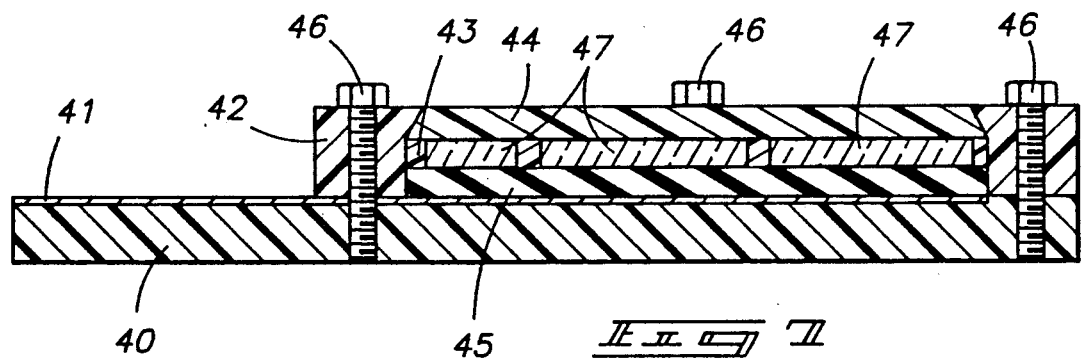
_FIG. 7_
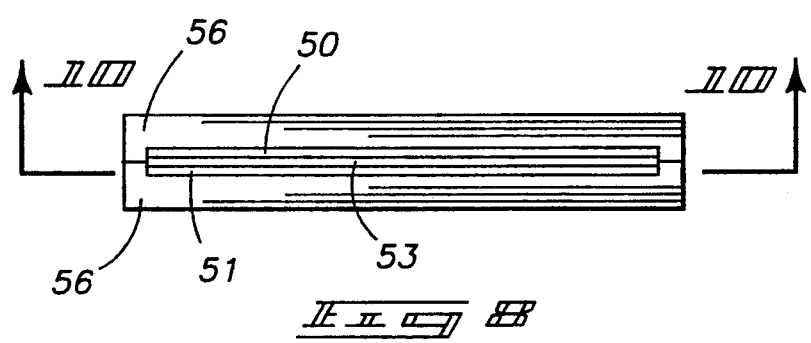
_FIG. 8_
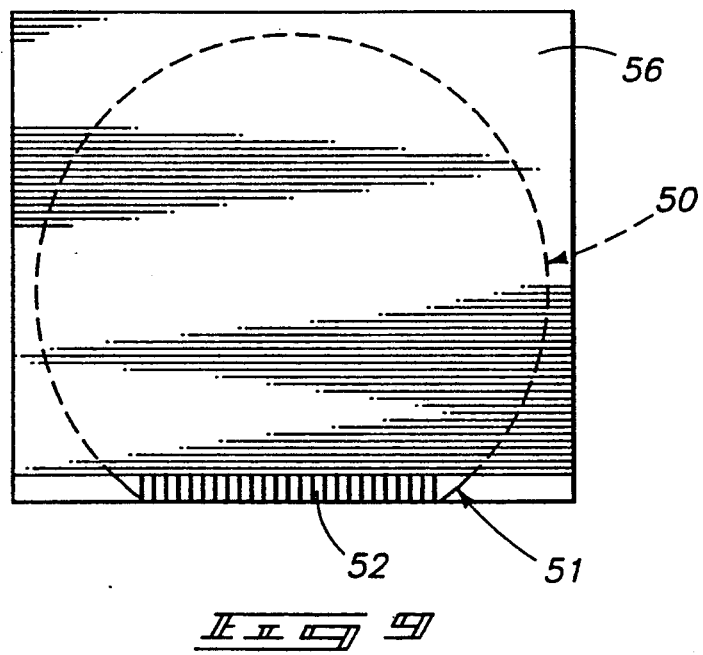
_FIG. 9_

SEMICONDUCTOR ASSEMBLY UTILIZING ELASTOMERIC SINGLE AXIS CONDUCTIVE INTERCONNECT

RELATED APPLICATION DATA

This application is a continuation-in-part application of U.S. patent application Ser. No. 07/575,179 filed on Aug. 30, 1990 entitled "Semiconductor Assembly Utilizing Elastomeric Single Axis Conductive Interconnect", which has been abandoned.

TECHNICAL FIELD

This disclosure pertains to packaging of semiconductor dies (wafers). It discloses semiconductor assemblies utilizing electrically anisotropically conductive elastomeric sheets as parts of interconnects between one or more dies (wafers) and a plurality of externally accessible edge conductors.

BACKGROUND OF THE INVENTION

Semiconductor assemblies that include one or more dies typically require individual packaging for each die to provide the required electrical contacts or connectors that can be soldered or otherwise connected to associated printed circuit boards. The search for new connector types by the electronics industry has been driven by the need for connections having a high contact pad density, high frequency operation, decreased size, low cost, and ease of replacement.

The present invention arose from efforts to redesign single in-line memory modules (SIMM). In such modules, a plurality of integrated memory circuits are interconnected on a substrate that includes traces leading to conventional edge conductors that permit the module to be plugged into a motherboard within a computer or other specific application. Present packaging requirements for integrated circuits involve placement of a die within an individual package having external contacts. The package must be mounted securely to a printed circuit board and the integrated circuit contacts must be soldered to make interconnections to the pads and traces of the printed circuit board.

A general example of current SIMM technology is illustrated in FIG. 2. A number of packaged memory integrated circuits 27 are mounted in-line along a supporting printed circuit board 13. The integrated circuit contacts 28 are soldered to traces 29 on board 13, and lead to a row of edge conductors 14. The production of such modules not only requires assembly of the board shown in FIG. 2, but also requires packaging and assembling of the individual integrated circuits themselves. Fabrication of the SIMM requires several steps to anchor and connect the circuitry of the integrated circuits and circuit board 13. Substitution of replacement circuits 27 in a completed assembly is both difficult and time consuming.

While not limited to SIMM applications, the present invention utilizes anisotropically conductive elastomeric sheets to form multiple electrical paths between individual dies having conductive pads along one surface and an interconnecting plate having corresponding conductive pads aligned in registration with the conductive pads of the die. The die and interconnecting plate compress the interposed sheet of elastomeric material to complete the desired electrical connections. The interconnecting plate can include traces leading to conventional edge connector elements. The resulting physical module containing these dies is relatively simple in structure. It requires no prepacking of individual dies and facilitates substitution of dies within a module when this becomes necessary.

The present invention can be applied to multi-chip assemblies of one or more types of semiconductor dies. The dies can either be utilized as discrete units or in wafer form. In the context of this document the term "dies" is intended to encompass individual chips that have been singulated from an entire wafer, as well as an entire wafer of integrated circuitry. In the context of the invention, multiple dies can be assembled in high density packaging without any wire-bonding, tape automated bonding or other conventional interconnect technology applied to such dies. The invention comprises a novel construction for registering dies relative to an interconnecting plate.

BRIEF DESCRIPTION OF THE DRAWINGS

Preferred embodiments of the invention are illustrated in the accompanying drawings, in which:

FIG. 1 is an exploded diagrammatic perspective view of the basic elements of the invention;

FIG. 2 is a diagrammatic plan view of a prior art single in-line memory module (SIMM) described in the "Background" section above;

FIG. 3 is an exploded perspective view of a SIMM produced according to the present disclosure;

FIG. 4 is an exploded elevational view of the SIMM of FIG. 3;

FIG. 5 is an enlarged transverse section view of the assembled SIMM such as would be taken through the location of line 5—5 of FIG. 3;

FIG. 6 is an exploded perspective view of a second embodiment of the invention;

FIG. 7 is an enlarged transverse sectional view of the assembled FIG. 6 component as would be taken along the location of line 7—7 in FIG. 6;

FIG. 8 is an assembled side view of a third embodiment;

FIG. 9 is a plan view of the construction of FIG. 8;

DETAILED DESCRIPTION OF THE PREFERRED EMBODIMENTS

Figure 10:
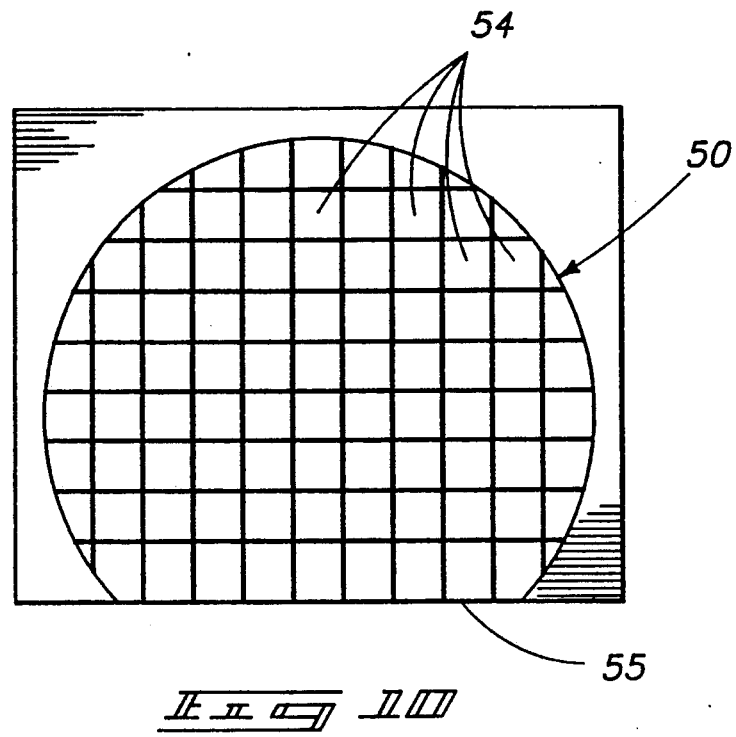
FIG. 10 is a sectional view taken along line 10—10 in FIG. 8.
Figure 11:
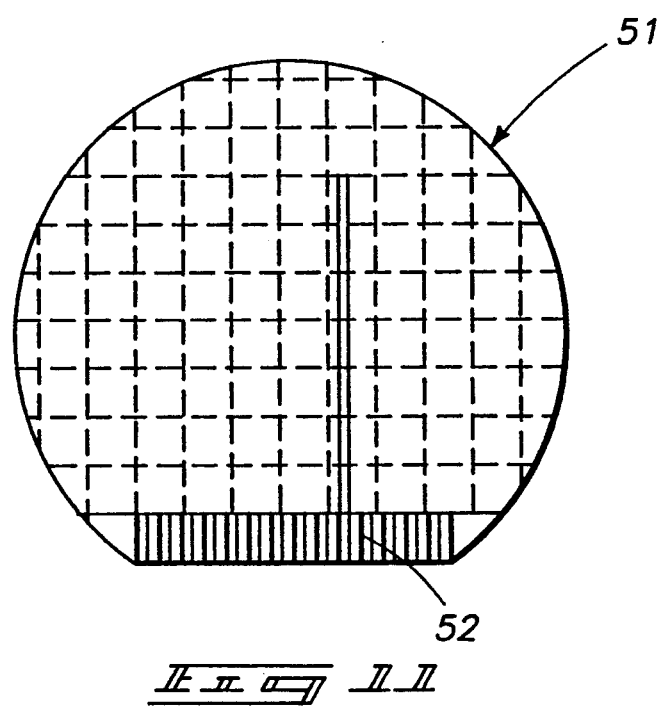
FIG. 11 is a plan view of a wafer scale integrated wafer.

The following disclosure of the invention is submitted in furtherance with the constitutional purpose of the U.S. Patent Laws "to promote the progress of science and useful arts" (Article 1, Section 8).

In accordance with the invention, a semiconductor assembly comprises:

a die having substantially planar first and second engagement surfaces, a defined thickness therebetween, and having external edges which define a die external shape, the first engagement surface including one or more conductive pads;

a base having an opening formed therein, the base opening having peripheral edges which define an opening shape which is complementary to the die external shape, the opening being sized to receive and engage the die, the die being so received within the base opening with the opening edges engaging the die edges to spatially fix the die in a selected orientation in a plane parallel to the die first planar engagement surface;

an interconnecting plate having at least one substantially planar engagement surface facing the first planar engagement surface of the die received within the base opening, the plate planar engagement surface having one or more conductive pads and conductive traces formed thereon, a least one conductive pad of the plate planar engagement surface being spatially aligned with one conductive pad on the first engagement surface of the die received within the base opening;

a sheet of anisotropically conductive elastomeric material that is electrically conductive in a direction across its thickness, the sheet being interposed between the base and interconnecting plate between the first engagement surface of the die and engagement surface of the interconnecting plate; and clamping means engaging the base and interconnecting plate for urging the die and plate toward one another in spatial registration to conductively engage the at least one conductive pad of the die with the at least one conductive pad of the interconnecting plate through the sheet of anisotropically conductive elastomeric material.

The present invention is first described basically with reference to FIGS. 1 and 12-15, which diagrammatically illustrate the basic elements of an assembly in accordance with the invention. The packaged semiconductor assembly shown in these drawings is designed about a die 10 having substantially planar first and second engagement surfaces 60 and 61, respectively (FIGS. 13 and 14), and has a defined thickness therebetween. Die 10 has external edges 62 which define a die external shape. In the depicted embodiment, the external shape is in the form of a square or rectangle. First engagement surface 60 includes one or more conductive pads, with only a single conductive pad 12 being illustrated in FIGS. 12-15 for clarity. Die 10 can be of any desired type of semiconductor die. It can be a single unit. More commonly the packaged assembly will include a plurality of dies 10 which can either be identical to one another or can comprises a variety of integrated circuits and/or components and/or shapes.

Die 10 is mounted within a supporting housing or base 11 having a respective opening 63 formed therein. Base opening 63 has peripheral edges 64 (FIGS. 13 and 14) which define an opening 63 shape which is complementary to the external shape of die 10 defined by its edges 62. Opening edges 64 are not visible in FIG. 12 due to the degree of enlargement. Opening 63 is as well sized to snugly receive and engage die 10. Specifically, die 10 is received within base opening 63 with opening edges 64 engaging die edges 62 to spatially fix the die in a selected orientation in a plane parallel to die first planar engagement surface 60. The preferred fit is just large enough to receive the die, but sufficiently snug to prevent appreciable movement of die 10 within opening 63.

Figure 15:
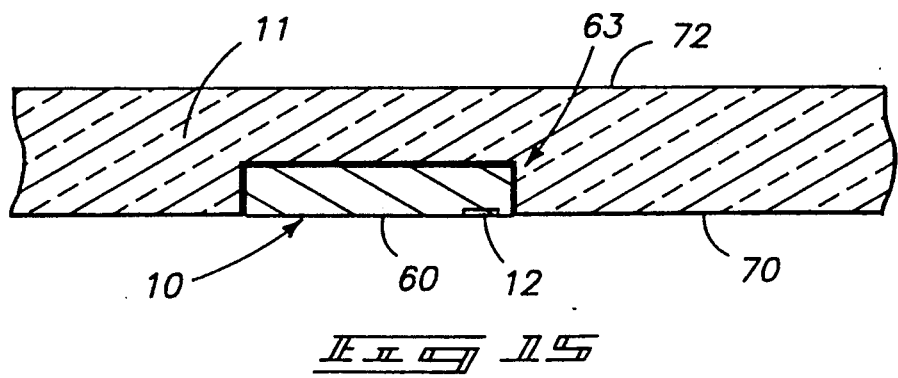
FIG. 15 is an enlarged fragmentary sectional view of a certain portion of the exploded views of FIG. 1, FIG. 12 and FIG. 13.

More particularly, base 11 includes a first planar engagement surface 70 and opposed second planar engagement surface 72. Base opening 63 is in the form of a recess formed into base 11 from first base planar engagement surface 70. The recess has a planar recess base surface 75. (FIG. 13), which defines a recess or opening depth which is substantially equal to the thickness of die 10 (FIG. 15). Die 10 is received within recess or opening 63, with die second planar engagement surface 61 being received against planar recess base surface 75, and die first planar engagement surface 60 being substantially coplanar with first base planar engagement surface 70 (FIG. 15).

The packaged semiconductor assembly also includes an interconnecting plate 15. Plate 15 has opposed substantially planar first and second engagement surfaces 66, 67 respectively. First planar engagement surface 66 faces relative to first planar engagement surface 60 of die 10 received within base opening 63. First plate planar engagement surface 66 has areas 69 (FIG. 1) which are spatially registered relative to dies 10. Areas 69 have one or more conductive pads 16 and associated conductive traces 17. As is apparent from the drawings, the designated conductive pad 16 of FIG. 1 on plate planar engagement surface 66 is spatially aligned with conductive pad 12 on first engagement surface 60 of die 10 which is received within opening 63. Conductive traces 17 can lead from one area to another or to input/output connections in the form of a conventional pattern of edge connectors 18 (FIG. 1). Portions of traces 17 can be covered by a layer of electrically insulating material 19 (FIG. 12) to prevent short circuits along their respective paths.

Interposed between die 10 and plate 15 is a sheet of anisotropically conductive elastomeric material generally designated with numeral 20. Elastomeric sheet 20 is a commercially available product. It is electrically conductive in a direction across its thickness and nonconductive across its width and length. This type of material is generally known as an "elastomeric single axis conductive interconnect", or ECPI. An example of a suitable interconnect material between die 10 and plate 15 is described in the Nov. 15, 1988 of the *Journal of Applied Physics*, pp. 6008-6010, in an article entitled "New, Z-direction Anisotropically Conductive Composites" by Jin et al., which is hereby incorporated into this disclosure by reference. Other available materials having equivalent conductive properties can be substituted in place of that specifically described.

Figure 12:
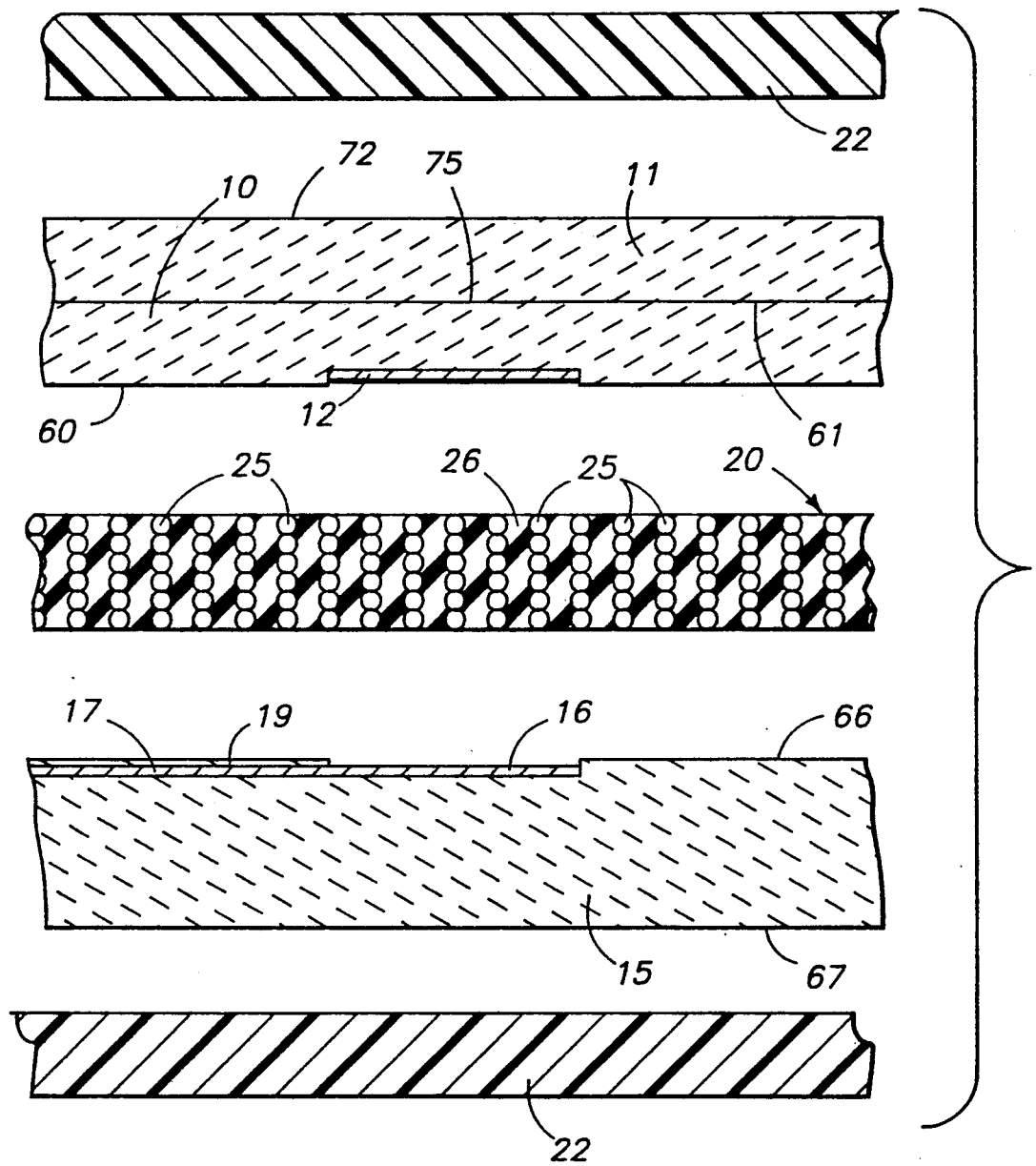
FIG. 12 is an enlarged exploded fragmentary sectional view illustrating the basic elements of the semiconductor assembly of FIG. 1.
Figure 13:
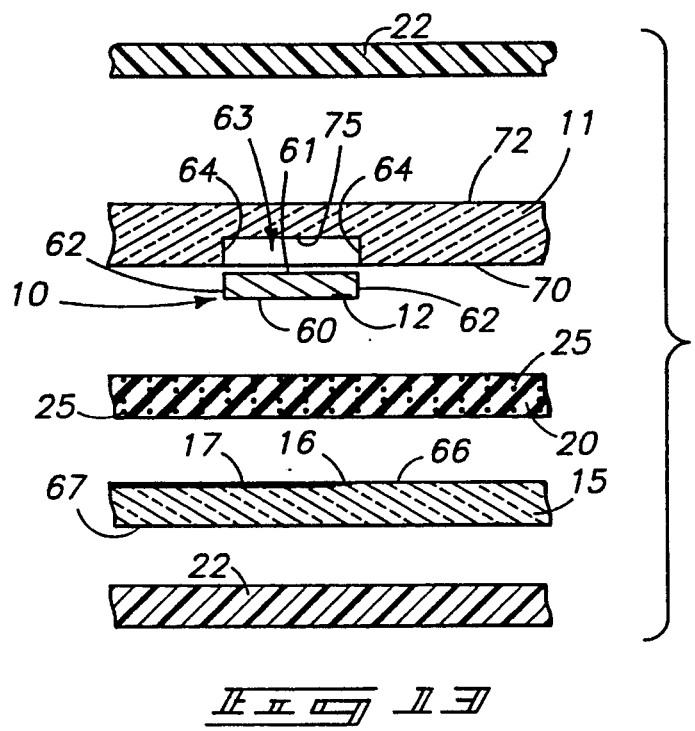
FIG. 13 is an enlarged exploded fragmentary sectional view illustrating the basic elements of the conductor assembly of FIG. 1, but is not as enlarged as the view of FIG. 12.
Figure 14:
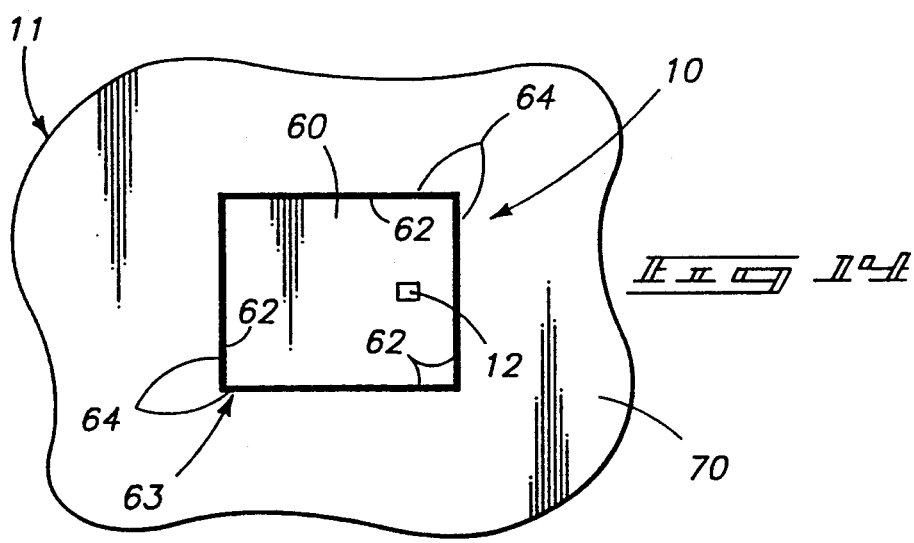
FIG. 14 is an enlarged plan view of a single die and base plate incorporated in the assembly of FIGS. 1, 12 and 13.

In the illustrated embodiment, the elastomeric sheet 20 is constructed of parallel columns of conductive spheres 25 separated by an elastomeric insulating material 26 (FIG. 12). Each column or chain of spheres 25 forms a conductive path through insulating material 26 to electrically interconnect for example conductive pad 12 with conductive pad 16. The density of the columns of spheres 25 should be such as to present multiple conductive paths across each pair of spatially registered pads 12, 16.

Clamping means are provided for engaging base 11 and interconnecting plate 15 for urging die 10 and plate 15 toward one another in spatial registration to conductively engage the at least one conductive pad 12 of die 10 which the at least one conductive pad 16 of interconnecting plate 15 through sheet 20 of anisotropically conductive elastomeric material. In other words, elastomeric sheet 20 is preferably compressed between die 10 and plate 15 to accommodate minor surface variations in the opposed facing surfaces that come into contact with it. The resulting electrical connection(s) leads through traces 17 to edge conductors 18, which can be attached to an external circuit board or other electronic equipment (not shown) by conventional connector technology. In the depicted embodiment, the clamping means includes a pair of rigid outer backing plates 22. One plate 22 overlies second planar engagement surface 67 of interconnecting plate 15, with the other of which overlies planar engagement surface 72 of base 11. Means for compressing plates 12 inwardly relative to one another could be provided by screws or other clamps, as will be apparent from the continuing discussion with respect to other embodiments.

FIGS. 3-5 illustrate an application of the invention to the production of electronic memories of single in-line memory modules (SIMM). Such modules are used as memory expansion boards in personal computers. They include a plurality of memory circuits mounted to a supporting circuit board for attachment to a mother board by conventional edge conductors. A single in-line memory module constructed in accordance with this disclosure might include a base plate 36 (corresponding to the above-described interconnecting plate) and an overlying pressure plate 30 having recessed openings 37 formed therein (pressure plate 30 corresponding to the base above). Pressure plate 30 covers all but one edge of base plate 36, leaving edge conductors 34 formed on base plate 36 exposed for interconnection to an associated circuit board or conventional connector (not shown). A row of dies 31 containing desired memory circuit components can be arranged individually within complementary recesses 37 formed across one engagement surface of pressure plate 30. The interposed elastomeric interconnect is shown at 33. Suitable fasteners (not shown) might join pressure plate 30 and base plate 36 to apply a suitable compressive force to interconnect 33. The entire module can be readily constructed without any soldering or bonding of contacts. Dies 31 can be supported within the complementary recesses 37 without any permanent attachment and are readily interchangeable for testing, repair or replacement.

FIGS. 6 and 7 show an alternate structure. In this assembly, a base interconnecting plate 40 is again provided with edge conductors 41. The pressure plate is constructed in three components, namely, a frame 42, an apertured insert 43 and a rigid backing sheet or plate 44. Apertured insert 43 includes apertures or openings 79 which are formed entirely through insert 43 between its respective opposing planar engagement surfaces. The various apertures 79 are complementary in shape and size to respective individual dies 47 which are located therewithin. The thickness of base 43 is substantially the same as the respective die thickness. Again, an elastomeric interconnect 45 is interposed between dies 47 located within apertured insert 43 and supporting interconnecting base 40. Base 40 would include conductive pads and traces (not shown) leading to edge connectors 41. Fasteners in the form of bolts 46 (FIG. 7) structurally connect with components of the assembly to maintain them in registration with one another and to apply compressive force to the elastomeric interconnect 45.

FIGS. 8-11 illustrate an embodiment utilizing an entire wafer. This is particularly applicable to applications requiring multiple memory circuit chips, but can be applied to other forms of chips as well. The laminated semiconductor assembly shown in FIG. 8 includes a circuit wafer 50 containing multiple discrete chips 54 and an opposed interconnecting plate in the form of an integrating wafer 51, primarily containing conductive paths and wires leading to edge conductors 52. The wafer flat 55 across wafer 50 is cut back to leave the edge connectors 52 exposed for subsequent assembly purposes. Wafer 51 can also contain dies and/or circuit devices when required.

The two wafers 50, 51 are mounted in opposition across an elastomer interconnect 53 and are supported within recesses of outer backing plates 56 (FIG. 8). In this embodiment, no individual handling of the respective chips 54 is required. High density mounting of memory chips in a usable modular assembly can be achieved at low cost.

In compliance with the statute, the invention has been described in language more or less specific as to structural features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor assembly comprising:
    a die having substantially planar first and second engagement surfaces, a defined thickness therebetween, and having external edges which define a die external shape, the first engagement surface including one or more conductive pads;
    a base having an opening formed therein, the base opening having peripheral edges which define an opening shape which is complementary to the die external shape, the opening being sized to receive and engage the die, the die being so received within the base opening with the opening edges engaging the die edges to spatially fix the die in a selected orientation in a plane parallel to the die first planar engagement surface;
    an interconnecting plate having at least one substantially planar engagement surface facing the first planar engagement surface of the die received within the base opening, the plate planar engagement surface having one or more conductive pads and conductive traces formed thereon, at least one conductive pad of the plate planar engagement surface being spatially aligned with one conductive pad on the first engagement surface of the die received within the base opening;
    a sheet of anisotropically conductive elastomeric material that is electrically conductive in a direction across its thickness, the sheet being interposed between the base and interconnecting plate between the first engagement surface of the die and engagement surface of the interconnecting plate; and
    clamping means engaging the base and interconnecting plate for urging the die and plate toward one another in spatial registration to conductively engage the at least one conductive pad of the die with the at least one conductive pad of the interconnecting plate through the sheet of anisotropically conductive elastomeric material.

2. The semiconductor assembly of claim 1 wherein the interconnecting plate further includes a plurality of edge conductors operably connected to the traces.

3. The semiconductor assembly of claim 1 wherein the interconnecting plate includes a second planar engagement surface opposing the one planar engagement surface, the base includes a planar engagement surface, the assembly further comprising rigid backing plates overlying the second planar engagement surface of the interconnecting plate and the planar engagement surface of the base.

4. The semiconductor assembly of claim 1 wherein the base includes first and second engagement surfaces and a thickness defined therebetween, the base opening extending entirely through the base between the base first and second engagement surfaces.

5. The semiconductor assembly of claim 4 wherein the interconnecting plate includes a second planar engagement surface opposing the one planar engagement surface, the assembly further comprising rigid backing plates overlying the second planar engagement surface of the interconnecting plate and the second planar engagement surface of the base.

6. The semiconductor assembly of claim 1 wherein the base includes a first planar engagement surface, the base opening being defined by a recess formed into the base from the first base planar engagement surface, the recess having a planar recess base surface, the recess having a depth which is substantially equal to the die thickness, the die being received within the recess with the die second planar engagement surface being received against the planar recess base surface and the die first planar engagement surface being substantially coplanar with the first base planar engagement surface.

7. The semiconductor assembly of claim 6 wherein the interconnecting plate includes a second planar engagement surface opposing the one planar engagement surface, the base includes a second planar engagement surface, the assembly further comprising rigid backing plates overlying the second planar engagement surface of the interconnecting plate and the second planar engagement surface of the base.

8. A semiconductor assembly comprising:
a plurality of dies having substantially planar first and second engagement surfaces, engagement surfaces including one or more conductive pads, defined thicknesses therebetween, and external edges which define die eternal shapes, the first engagement surfaces including one or more conductive pads;
a base having a plurality of openings formed therein, the base openings having peripheral edges which define opening shapes which are complementary to the respective die external shapes, the respective openings being sized to receive and engage respective dies, the respective dies being so received within the respective base openings with the opening edges engaging the respective die edges to spatially fix the respective dies in a selected orientation in a plane parallel to the respective die first planar engagement surfaces;
an interconnecting plate having at least one substantially planar engagement surface facing the first planar engagement surfaces of the dies received within the base openings, the plate planar engagement having a plurality of conductive pads and traces formed thereon, the conductive pads of the plate planar engagement surface being spatially aligned with respective conductive pads on the first planar engagement surfaces of the dies received within the base openings;
a sheet of anisotropically conductive elastomeric material that is electrically conductive in a direction across its thickness, the sheet being interposed between the base and interconnecting plate between the first engagement surfaces of the dies and engagement surface of the interconnecting plate; and
clamping means engaging the base and interconnecting plate for urging the dies and plate toward one another in spatial registration to conductively engage the conductive pads of the dies with conductive pads of the interconnecting plate through the sheet of anisotropically conductive elastomeric material.

9. The semiconductor assembly of claim 8 wherein the interconnecting plate further includes a plurality of edge conductors operably connected to the traces.

10. The semiconductor assembly of claim 8 wherein the interconnecting plate includes a second planar engagement surface opposing the one planar engagement surface, the base includes a planar engagement surface, the assembly further comprising rigid backing plates overlying the second planar engagement surface of the interconnecting plate and the planar engagement surface of the base.

11. The semiconductor assembly of claim 8 wherein the base includes first and second engagement surfaces and a thickness defined therebetween, the base openings extending entirely through the base between the first and second engagement surfaces.

12. The semiconductor assembly of claim 11 wherein the interconnecting plate includes a second planar engagement surface opposing the one planar engagement surface, the assembly further comprising rigid backing plates overlying the second planar engagement surface of the interconnecting plate and the second planar engagement surface of the base.

13. The semiconductor assembly of claim 8 wherein the base includes a first planar engagement surface, the base openings being defined by recesses formed into the base from the first base planar engagement surface, the recesses having planar recess base surfaces, the recesses having depths which are substantially equal to the respective die thickness, the respective dies being received within the respective recessed with the die second planar engagement surfaces being received against the planar recess base surfaces and the die first planar engagement surfaces being substantially coplanar with the first base planar engagement surface.

14. The semiconductor assembly of claim 13 wherein the interconnecting plate includes a second planar engagement surface opposing the one planar engagement surface, the base includes a second planar engagement surface, the assembly further comprising rigid backing plates overlying the second planar engagement surface of the interconnecting plate and the second planar engagement surface of the base.

15. The semiconductor assembly of claim 13 wherein the dies comprise electronic memories arranged in a single in-line memory module.

* * * * *